(12) United States Patent
Shim et al.

(10) Patent No.: US 7,399,658 B2
(45) Date of Patent: Jul. 15, 2008

(54) PRE-MOLDED LEADFRAME AND METHOD THEREFOR

(75) Inventors: Il Kwon Shim, Singapore (SG); Diane Sahakian, Tempe, AZ (US); Kambhampati Ramakrishna, Chandler, AZ (US); Seng Guan Chow, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 11/459,317

(22) Filed: Jul. 21, 2006

(65) Prior Publication Data

US 2007/0111379 A1    May 17, 2007

Related U.S. Application Data

(63) Continuation-in-part of application No. 11/163,547, filed on Oct. 21, 2005, now abandoned.

(51) Int. Cl.
*H01L 21/00* (2006.01)

(52) U.S. Cl. .................. 438/106; 438/112; 257/676; 257/666

(58) Field of Classification Search .............. 438/106, 438/112; 257/666, 676, 787
See application file for complete search history.

(56) References Cited

U.S. PATENT DOCUMENTS

| | | | | |
|---|---|---|---|---|
| 5,521,429 A | * | 5/1996 | Aono et al. | 257/676 |
| 6,420,779 B1 | | 7/2002 | Sharma et al. | |
| 6,455,356 B1 | * | 9/2002 | Glenn et al. | 438/123 |
| 6,482,680 B1 | | 11/2002 | Khor et al. | |
| 6,507,120 B2 | | 1/2003 | Lo et al. | |
| 6,577,012 B1 | | 6/2003 | Greenwood et al. | |
| 6,684,496 B2 | * | 2/2004 | Glenn | 29/841 |
| 6,815,833 B2 | | 11/2004 | Lee et al. | |
| 6,828,220 B2 | | 12/2004 | Pendse et al. | |

* cited by examiner

*Primary Examiner*—Roy K Potter
(74) *Attorney, Agent, or Firm*—Mikio Ishmaru (57) ABSTRACT

A method of manufacturing a pre-molded leadframe for use in a semiconductor package includes providing a leadframe having a die pad and a plurality of leads. A first molding material is formed in the leadframe to expose the upper surface of the die pad and the upper surfaces of the plurality of leads.

20 Claims, 9 Drawing Sheets

PRE-MOLDED LEADFRAME AND METHOD THEREFOR

CROSS-REFERENCE TO RELATED APPLICATION(S)

This application is a continuation-in-part of U.S. patent application Ser. No. 11/163,547 filed Oct. 21, 2005 now abandoned.

TECHNICAL FIELD

The present invention relates generally to semiconductors, and more particularly to a method and apparatus for manufacturing semiconductors using leadframes.

BACKGROUND ART

Integrated circuit dies are conventionally enclosed in plastic packages that provide protection from hostile environments and enable electrical interconnection between the integrated circuit die and an underlying substrate such as a printed circuit board (PCB). The leadframe is the central supporting structure of such a package. A portion of the leadframe is internal to the package, i.e., completely surrounded by the plastic encapsulant.

For purposes of high-volume, low-cost production of chip packages, a current industry practice is to etch or stamp a thin sheet of metal material to form a panel or strip that defines multiple leadframes. A single strip may be formed to include multiple arrays, with each such array including a multiplicity of leadframes in a particular pattern. In a typical semiconductor package manufacturing process, the integrated circuit dies are mounted and wire bonded to respective ones of the leadframes, with the encapsulant material then being applied to the strips to encapsulate the integrated circuit dies, bond wires, and portions of each of the leadframes in the above-described manner.

Upon the hardening of the encapsulant material, the leadframes within the strip are cut apart or singulated for purposes of producing the individual semiconductor packages. Such singulation is typically accomplished via a saw singulation process. In this process, a saw blade is advanced along "saw streets" which extend in prescribed patterns between the leadframes as required to facilitate the separation of the leadframes from each other in the required manner.

In current, conventional leadframe design, the leadframe does not define a continuous, uninterrupted surface. Rather, individual leads of the leadframe are separated from each other and from the peripheral edge of a die pad (if included in the leadframe) by narrow gaps. The die pad of the leadframe, if included therein, is the supporting structure to which the die is typically attached.

In conventional leadless semiconductor packages, an adhesive tape is attached to the bottom of the leadframe to provide mechanical support and rigidity for the leadframe structure during material handling in the assembly process. The adhesive tape also helps prevent mold flash during the molding process. However, the adhesive tape contributes to the bouncing lead effect during the wire bonding process, which may result in poor wire bond quality, and/or non-stick on lead (NSOL) problems. The adhesive tape also may hinder stabilization of half-etched lead fingers during wire bonding.

In flip chip leadless semiconductor packages, die bond pads connected from solder bumps through half-etched lead fingers to the external leads of the semiconductor package. A support block typically is used to stabilize the lead fingers; however, the support block can become obstructed with the use of adhesive tape.

Film assisted molding equipment has been developed to address these problems. Taping and de-taping processes can be accomplished in film assisted molding equipment, but issues still arise during block molding high-density leadless leadframes. In a block molding process, a large mold chase is used to form a mold cap over an array of leadless devices before singulation, which separates the individual devices in the array. During block molding processes, the leadless devices can be deflected due to the interaction of shear stresses and bending moments that result from clamping the mold as well as thermally induced stresses. Accordingly, mold flash may still occur during the molding process reducing device reliability.

In flip chip on leadframe packages, solder bump connections between the die and the lead fingers are generally formed using a solder reflowing process. The solder resist pads must properly be defined on the leads or the solder bumps may collapse resulting in incomplete under fill or mold compound coverage in the gap between the flip chip and the leadframe. Additionally, solder dispersion on the leads can result in solder bridging, die placement misalignment, or tilting. One approach to prevent flip chips from dislocating or tilting on the leads is to dispose the solder bumps in concavities formed in the leads and die attach paddle. Solder bumps still may collapse if solder resist pads are not precisely defined around the concavities.

Typical methods of defining solder resist pads for flip chip on leadframe semiconductor packages are labor intensive, time consuming, and not cost effective. In one such method, a non-wettable barrier that separates a wettable solder resist pad from a wettable lead surface is formed using a laser ablation process. In another method, a solder bump with a melting point higher than a eutectic solder paste is used to control the standoff height between the die and the leadframe. Solder bumps still can be dislocated on the leads due to excessive wetting of the solder paste on the leads. The use of a gold stud bumping process also has been proposed, however, stud bumping is a serial process that requires an increased amount of time as the number of bumps required increases. Therefore, expensive, high-speed stud bumping equipment is needed to reduce the manufacturing time. Stud bump processes require more precise die placement equipment and are less tolerant of placement errors than self-aligning solder bump processes. Consequently, the gold stud bump process is more expensive than the typical solder bump process.

Solutions to these problems have been long sought but prior developments have not taught or suggested any solutions and, thus, solutions to these problems have long eluded those skilled in the art.

DISCLOSURE OF THE INVENTION

The present invention provides a method of manufacturing a semiconductor package including providing a leadframe having a die pad and a plurality of leads. A first molding material is formed in the leadframe to expose the upper surface of the die pad and the upper surfaces of the plurality of leads.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known system configurations and process steps are not disclosed in detail.

Likewise, the drawings showing embodiments of the device are semi-diagrammatic and not to scale and, particularly, some of the dimensions are for the clarity of presentation and are shown greatly exaggerated in the FIGs. Generally, the device can be operated in any orientation. In addition/ Also, where multiple embodiments are disclosed and described having some features in common, for clarity and ease of illustration and description thereof like features one to another will ordinarily be described with like reference numerals.

The term "horizontal" as used herein is defined as a plane parallel to the conventional plane or surface of the device, regardless of its orientation. The term "vertical" refers to a direction perpendicular to the horizontal as just defined. Terms, such as "on", "above", "below", "bottom", "top", "side" (as in "sidewall"), "higher", "upper", "lower", "over", and "under", are defined with respect to the horizontal plane.

Figure 1:
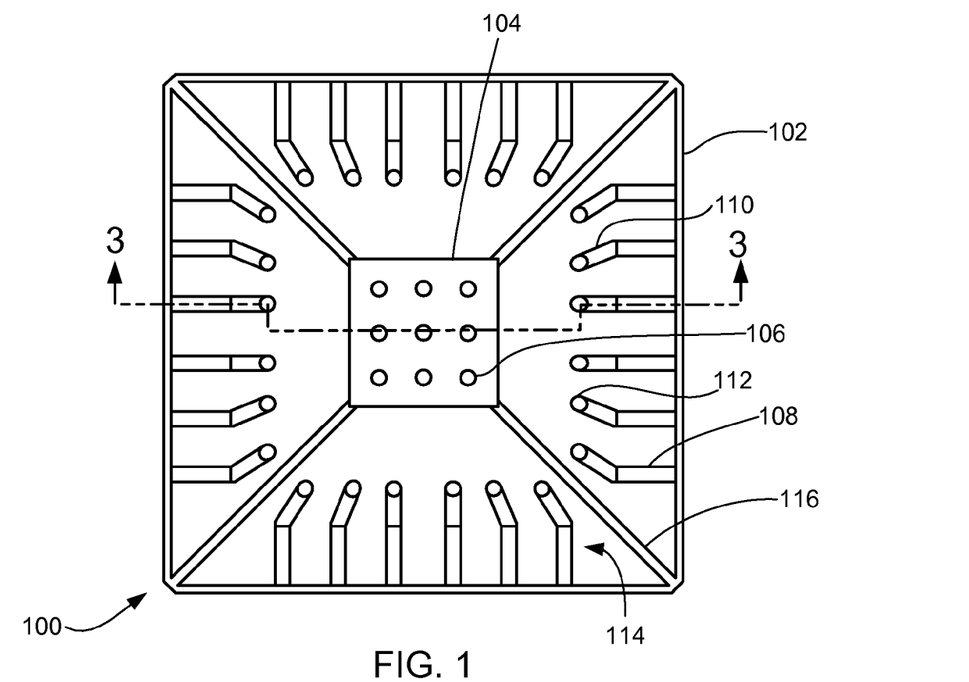
FIG. 1 is a top view of a leadframe at an intermediate stage of manufacture in accordance with an embodiment of the present invention.

Referring now to FIG. 1, therein is shown a top view of a leadframe 100 at an intermediate stage of manufacture in accordance with an embodiment of the present invention. The leadframe 100 includes an outer frame 102. A die pad 104 is positioned in the center of the outer frame 102. The die pad 104 has a number of thermal/ground bump pads 106 formed by etching the die pad 104. The leadframe 100 has a number of terminal lands 108 attached to the outer frame 102 and extending inwardly toward the die pad 104. Each of the number of terminal lands 108 is connected to an upper half-etched portion 110 and a number of terminal pads 112 to form a number of leads 114 that is connected to the outer frame 102. The die pad 104 is attached to the outer frame 102 by a number of tie bars 116 that connect the corners of the die pad 104 to the corners of the outer frame 102. Typically, the number of thermal/ground bump pads 106 and the upper half-etched portion 110 are formed using a conventional leadframe etching process.

Figure 2:
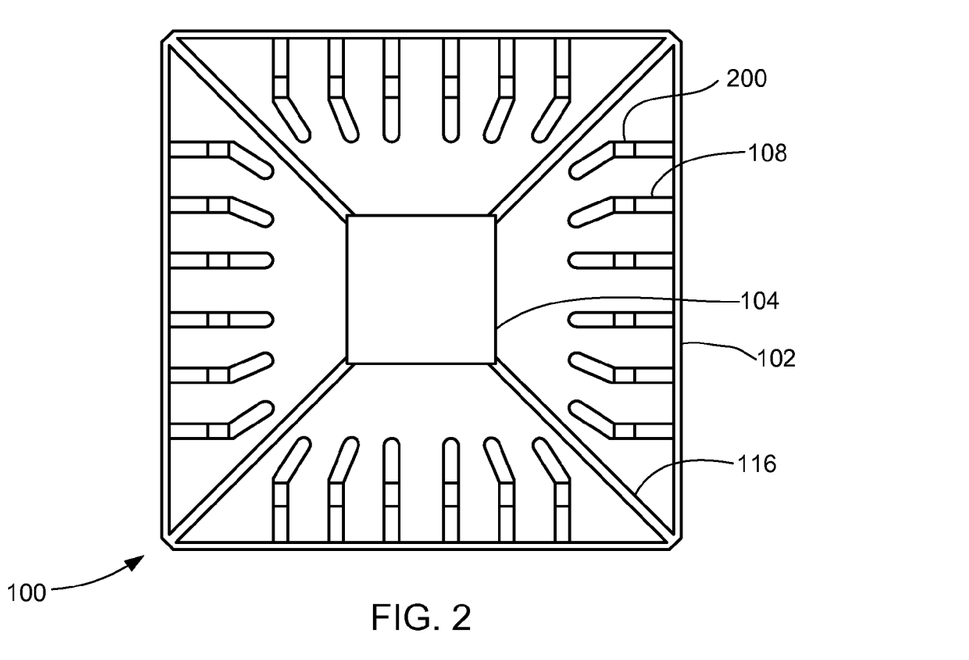
FIG. 2 is a bottom view of the structure of FIG. 1.

Referring now to FIG. 2, therein is shown a bottom view of the structure of FIG. 1. The leadframe 100 includes a lower half-etched portion 200 intermediate each of the number of terminal lands 108 and the bottom of each of a number of the upper half-etched portion 110 shown in FIG. 1. The lower half-etched portion 200 is formed using a conventional leadframe etching process.

Figure 3:
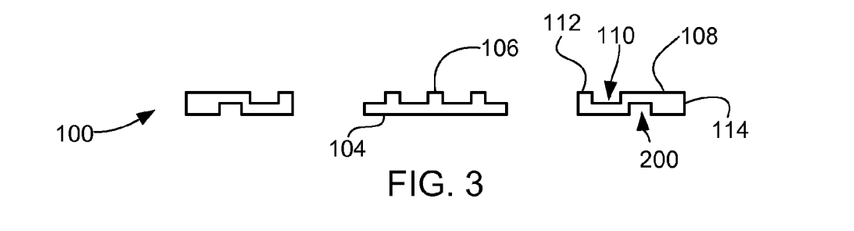
FIG. 3 is a cross-sectional view of the structure of FIG. 1 taken along line 3-3.

Referring now to FIG. 3, therein is shown a cross-sectional view of the structure of FIG. 1 taken along line 3-3. The leadframe 100 defines the number of thermal/ground bump pads 106 on the upper surface of the die pad 104. Each of the number of leads 114 includes the number of terminal lands 108, the upper half-etched portion 110, and the number of terminal pads 112. The bottom of each of the number of leads 114 includes the lower half-etched portion 200 intermediate the number of terminal lands 108 and the upper half-etched portion 110.

Figure 4:
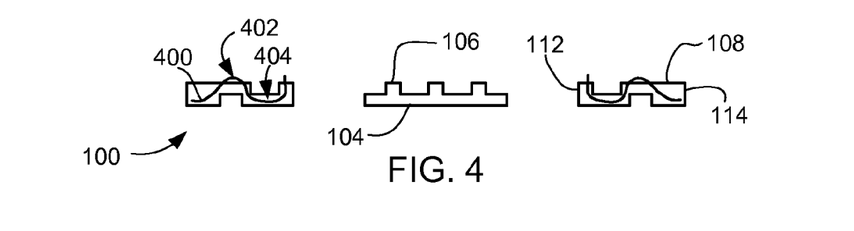
FIG. 4 is the structure of FIG. 3 with an optional stress relief and locking lead.

Referring now to FIG. 4, therein is shown the structure of FIG. 3 with an optional stress relief and locking lead 400. The optional stress relief and locking lead 400 can be positioned in the leadframe 100 between the number of leads 114 shown in FIGS. 1 and 2. The optional stress relief and locking lead 400 typically has a convex portion 402 and a concave portion 404. The optional stress relief and locking lead 400 is slightly compressed in the mold during the molding process as discussed below. Upon completion of the pre-molding process discussed below, the optional stress relief and locking lead 400 extends in a serpentine manner between the number of terminal pads 112 and the number of terminal lands 108 to provide additional stress relief and locking capability to the leadframe 100.

Figure 5:
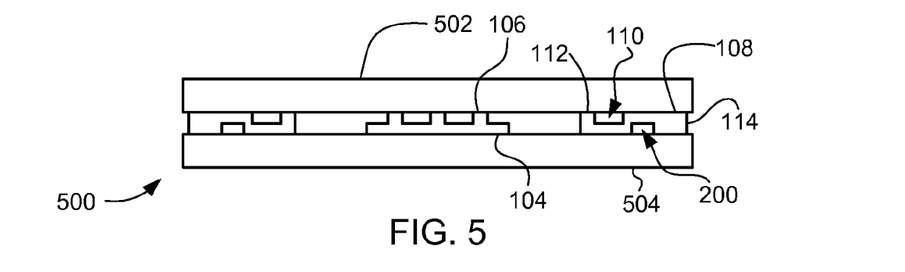
FIG. 5 is a cross-sectional view of the leadframe in a mold.

Referring now to FIG. 5, therein is shown a cross-sectional view of the leadframe 100 in a mold 500. The mold 500 includes a mold top plate 502 and a mold bottom plate 504. The mold top plate 502 and the mold bottom plate 504 can be clamped tightly at the top and bottom during the molding process to prevent mold flash and/or resin bleed on the number of thermal/ground bump pads 106, the number of terminal pads 112, and the number of terminal lands 108. During the molding process, the molding material, such as an epoxy, flows through the spaces created by a number of the upper half-etched portion 110, a number of the lower half-etched portion 200. The first molding material also flows in the spaces formed by the number of thermal/ground bump pads 106 on the die pad 104 in addition to the spaces between the die pad 104 and the number of leads 114.

Additionally, the number of thermal/ground bump pads 106 and the number of terminal pads 112 are defined during the molding process for self-aligning during subsequent flip chip solder reflow with no additional special pre-treatment, application of selective metal finishes, and/or solder resist deposition on the leadframe 100. In addition, there is no restriction with respect to the particular bump type used and/or its composition.

Figure 6:
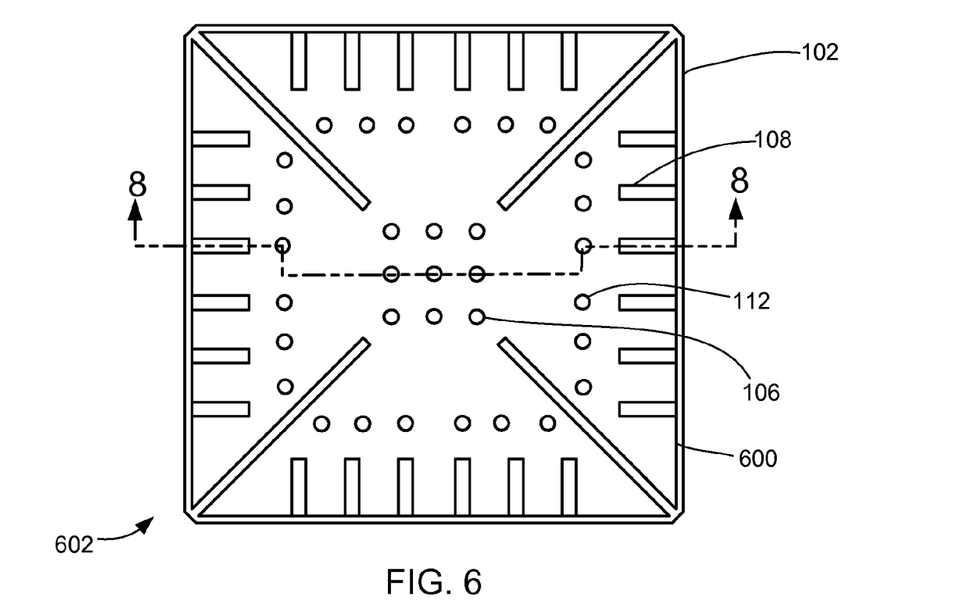
FIG. 6 is a top view of the structure of FIG. 1 after a pre-molding process.

Referring now to FIG. 6, therein is shown a top view of the structure of FIG. 1 after a pre-molding process, such as an injection molding or a transfer-molding process. The leadframe 100 has received a first molding material 600 during the molding process to form a pre-molded leadframe 602. Accordingly, a number of the upper half-etched portion 110 shown in FIG. 1 has been covered with the first molding material 600. The number of thermal/ground bump pads 106, the number of terminal pads 112, and the number of terminal lands 108 are exposed through the first molding material 600.

Figure 7:
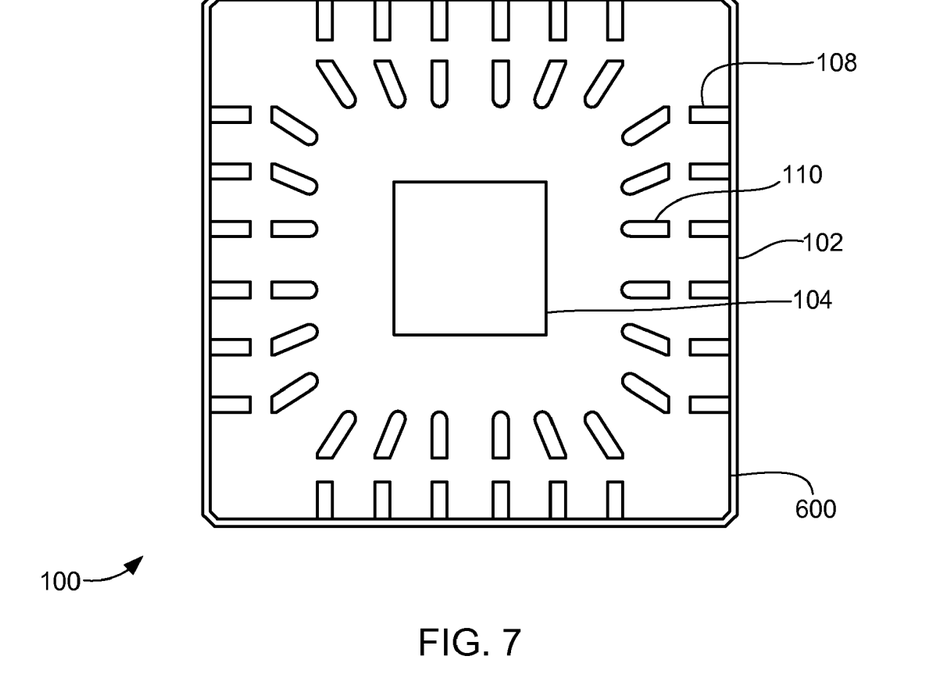
FIG. 7 is a bottom view of the structure of FIG. 6.

Referring now to FIG. 7, therein is shown a bottom view of the structure of FIG. 6. The pre-molded leadframe 602 has the bottom of the die pad 104 exposed through the first molding material 600. The bottom of the number of terminal lands 108 and the bottom of a number of the upper half-etched portion 110 also are exposed through the first molding material 600.

Figure 8:
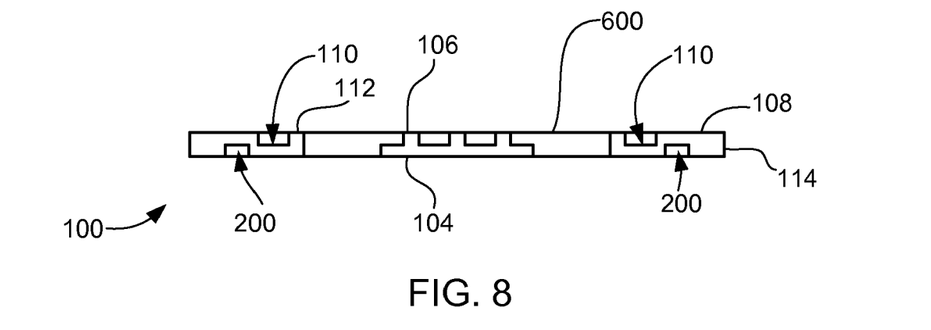
FIG. 8 is a cross sectional view of the structure of FIG. 6 taken along line 8-8.

Referring now to FIG. 8, therein is shown a cross sectional view of the structure of FIG. 6 taken along line 8-8. The pre-molded leadframe 602 after the pre-molding process has the spaces in the leadframe 100 filled with the first molding material 600. A number of the upper half-etched portion 110, a number of the lower half-etched portion 200, and the spaces around the number of thermal/ground bump pads 106 and the number of terminal pads 112 are filled with the first molding material 600. The space between the die pad 104 and the number of leads 114 also is filled with the first molding material 600.

Figure 9:
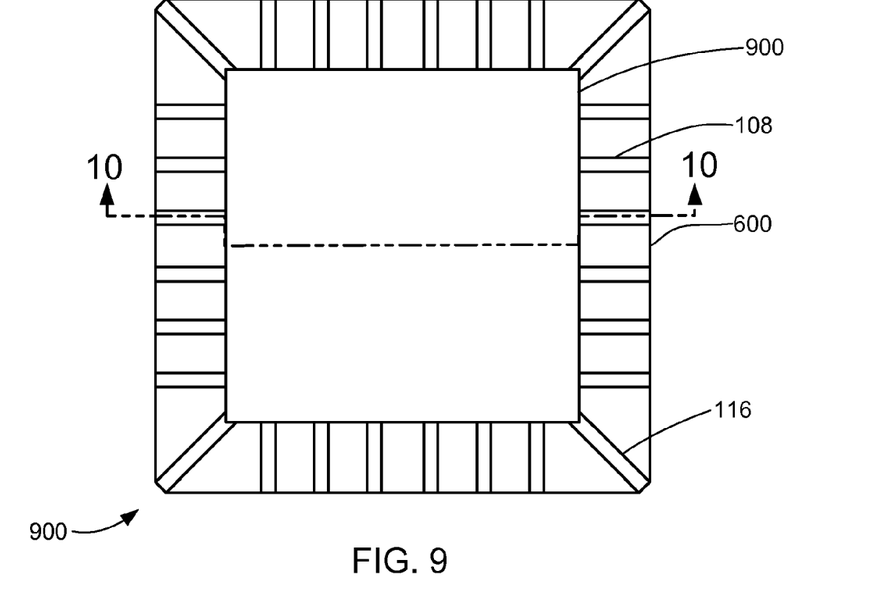
FIG. 9 is a top view of the structure of FIG. 6 after a flip chip assembly process to form a semiconductor package.

Referring now to FIG. 9, therein is shown a top view of the structure of FIG. 6 after a flip chip assembly process to form a semiconductor package 900. A die 902 is attached to the number of thermal/ground bump pads 106 and the number of terminal pads 112 of the pre-molded leadframe 602 shown in FIGS. 6 and 8.

Figure 10:
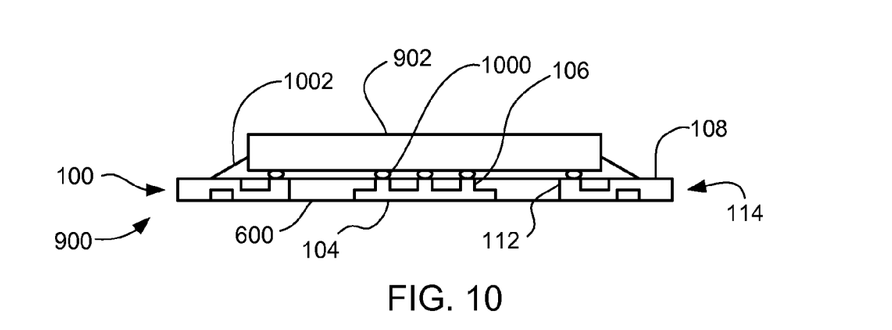
FIG. 10 is a cross-sectional view of the structure of FIG. 9 taken along line 10-10.

Referring now to FIG. 10, therein is shown a cross-sectional view of the structure of FIG. 9 taken along line 10-10. A metal finish has been performed to provide a wettable surface on the number of thermal/ground bump pads 106 and the number of terminal pads 112. A number of solder bumps 1000 is placed over the number of thermal/ground bump pads 106 and the number of terminal pads 112.

The die 902 is electrically connected to the number of thermal/ground bump pads 106 and the number of terminal pads 112 by using a solder reflow process on the number of solder bumps 1000. The pre-molded leadframe 602 provides a rigid and stable base during the metal finish process and the solder bump and die placement processes.

The die 902 is connected to the pre-molded leadframe 602 by attaching the die 902 to the pre-molded leadframe 602 using an underfill material layer 1002. The underfill material layer 1002 is a non-conductive underfill material, such as an epoxy. The underfill material layer 1002 compensates for the difference in thermal expansion between the die 902 and the leadframe 100 so the differences in thermal expansion do not damage the connection of the number of solder bumps 1000. The underfill material layer 1002 also protects the number of solder bumps 1000 from moisture or other environmental hazards and provides additional mechanical strength to the semiconductor package 900.

The underfill material layer 1002 typically is formed by dispensing the underfill material along the edges of the die 902. The underfill material is drawn into the gap between the die 902 and the leadframe 100 by capillary action and heat cured to form a permanent bond. Alternatively, the underfill material layer 1002 is formed in an underfill molding process by applying the underfill material in the gap between the die 902 and the leadframe 100 and allowing the underfill material to fill the gap as well as cover the entire die in the molding process.

Figure 11:
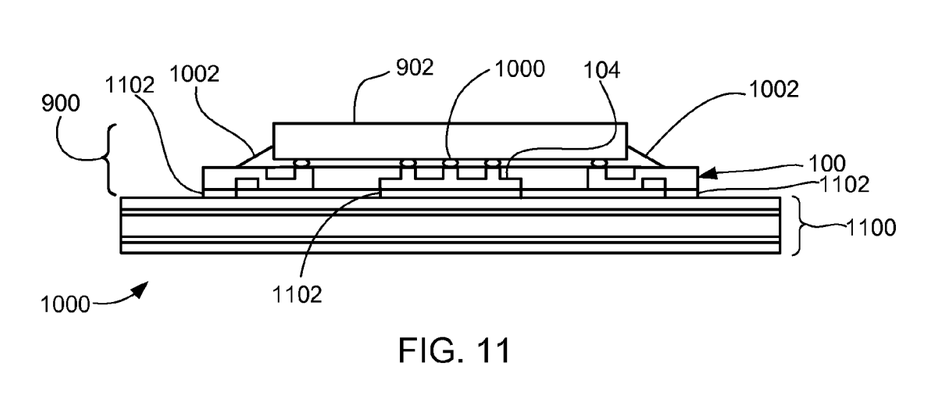
FIG. 11 is the structure of FIG. 10 after mounting of the semiconductor package to a printed circuit board.

Referring now to FIG. 11, therein is shown the structure of FIG. 10 after mounting of the semiconductor package 900 to a printed circuit board (PCB) 1100. The semiconductor package 900 is attached to the PCB using an adhesive or solder layer 1102.

Figure 12:
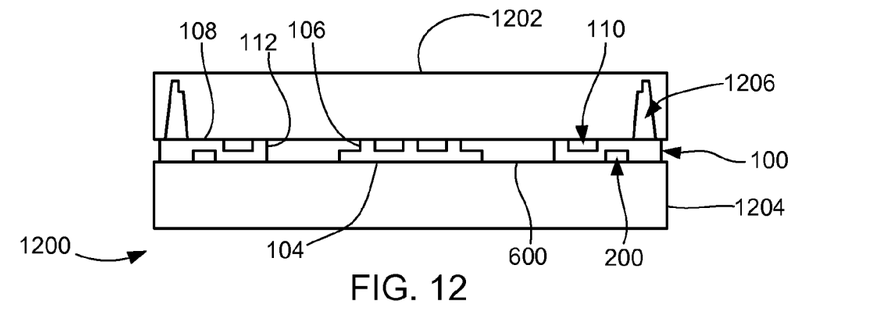
FIG. 12 is a cross-sectional view of the leadframe in a mold.

Referring now to FIG. 12, therein is shown a cross-sectional view of the leadframe 100 in a mold 1200. The mold 1200 includes a mold top plate 1202 and a mold bottom plate 1204. The mold top plate 1202 and the mold bottom plate 1204 can be clamped tightly at the top and bottom during the molding process to prevent mold flash and/or resin bleed on the number of thermal/ground bump pads 106, the number of terminal pads 112, and the number of terminal lands 108. The mold top plate 1202 has a number of cavities 1206 for defining a molded heat spreader holder as discussed below.

During the molding process, the first molding material 600, such as an epoxy, flows through the spaces created by a number of the upper half-etched portion 110, a number of the lower half-etched portion 200. The first molding material also flows in the spaces formed by the number of thermal/ground bump pads 106 on the die pad 104 in addition to the spaces between the die pad 104 and the number of leads 114. The first molding material 600 also flows into the number of cavities 1206.

Additionally, the number of thermal/ground bump pads 106 and the number of terminal pads 112 are defined during the molding process for self-aligning during subsequent flip chip solder reflow with no additional special pre-treatment, application of selective metal finishes, and/or solder printing on the pre-molded leadframe 602. In addition, there is no restriction with respect to the particular bump type used and/or its composition.

Figure 13:
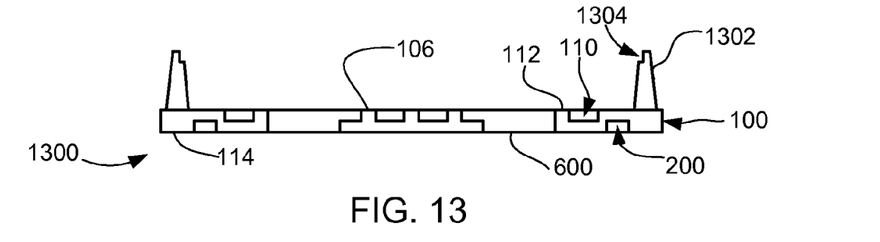
FIG. 13 is a pre-molded leadframe having an optional heat spreader holder.

Referring now to FIG. 13, therein is shown a pre-molded leadframe 1300 having an optional heat spreader holder 1302. The optional heat spreader holder 1302 is formed as an integral part of the pre-molded leadframe 1300. Typically, the optional heat spreader holder 1302 has an inwardly directed notch 1304 that provides support for subsequent mounting of a heat spreader.

The pre-molded leadframe 1300 after the pre-molding process has the spaces in the pre-molded leadframe 1300 filled with the first molding material 600. A number of the upper half-etched portion 110, a number of the lower half-etched portion 200, and the spaces around the number of thermal/ground bump pads 106 are filled with the first molding material 600. The space between the die pad 104 and the number of leads 114 also is filled with the first molding material 600.

Figure 14:
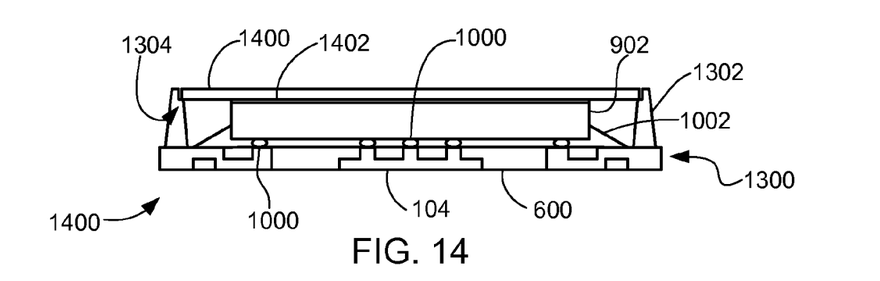
FIG. 14 is a the structure of FIG. 13 after attachment of the die and a heat spreader.

Referring now to FIG. 14, therein is shown the structure of FIG. 13 after attachment of the die 902 and a heat spreader 1400. It will be apparent to those skilled in the art from a reading of this description that a radiation shield or a transparent lid also may be used instead of the heat spreader 1400.

The die 902 is attached to the number of thermal/ground bump pads 106 and the number of terminal pads 112 of the pre-molded leadframe 1300.

A metal finish process has been performed to provide a wettable surface on the number of thermal/ground bump pads 106 and the number of terminal pads 112. The number of solder bumps 1000 is placed over the number of thermal/ground bump pads 106 and the number of terminal pads 112. The die 902 is connected to the pre-molded leadframe 1300 by attaching the die 902 to the pre-molded leadframe 1300 using the underfill material layer 1002 as described above with reference to FIG. 10. The die 902 is electrically connected to the number of thermal/ground bump pads 106 and the number of terminal pads 112 by using a solder reflow process on the number of solder bumps 1000. The pre-molded leadframe 1300 provides a rigid and stable base during the metal finish process and the solder bump and die placement processes.

The heat spreader 1400 is attached to the upper surface of the die 902 using a thermally conductive adhesive layer 1402. The outer edges of the heat spreader 1400 are positioned in the number of the inwardly directed notch 1304 formed in a number of the optional heat spreader holder 1302.

For illustrative purposes, the heat spreader 1400 is shown with the optional heat spreader holder 1302 although it is understood that the heat spreader 1400 may also be a shield attached to the pre-molded leadframe 1300 on a surface including the die pad 104 over the first molding material 600 or the number of terminal lands 108 of FIG. 1. Further the heatspreader 1400 can be attached to ground pads (not shown) over corners of the first molding material 600 or a top side of exposed pads (not shown) or leads (not shown) along edges of the pre-molded leadframe 1300.

Figure 15:
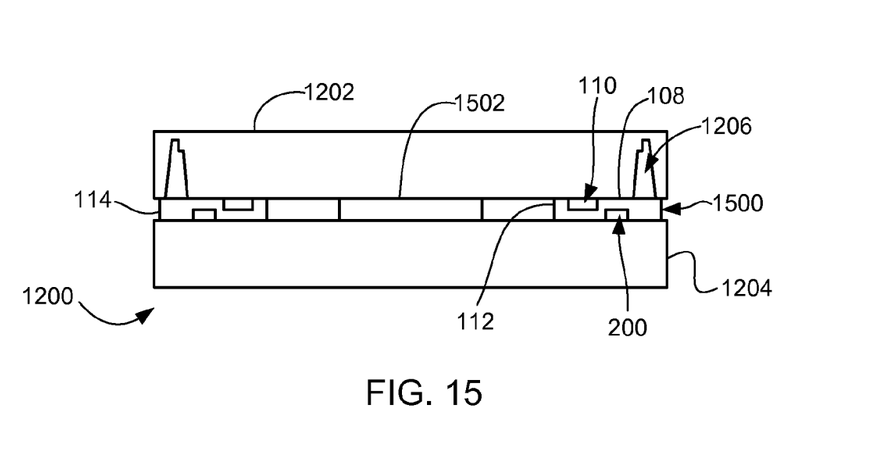
FIG. 15 is a cross-sectional view of another embodiment of a leadframe in the mold.

Referring now to FIG. 15, therein is shown a cross-sectional view of another embodiment of a leadframe 1500 in the mold 1200. The leadframe 1500 includes a die pad 1502 that does not have the number of thermal/ground bump pads 106 shown in FIGS. 1-14.

The mold 1200 includes the mold top plate 1202 and the mold bottom plate 1204. The mold top plate 1202 and the mold bottom plate 1204 can be clamped tightly at the top and bottom during the molding process to prevent mold flash and/or resin bleed on the die pad 1502, the number of terminal pads 112, and the number of terminal lands 108. The mold top plate 1202 has the number of cavities 1206 for defining the optional heat spreader holder 1302 as discussed below.

During the molding process, the first molding material 600, such as an epoxy, flows through the spaces created by a number of the upper half-etched portion 110, a number of the lower half-etched portion 200. The first molding material also flows in the spaces between the die pad 1502 and the number of leads 114. The first molding material 600 also flows into the number of cavities 1206.

Figure 16:
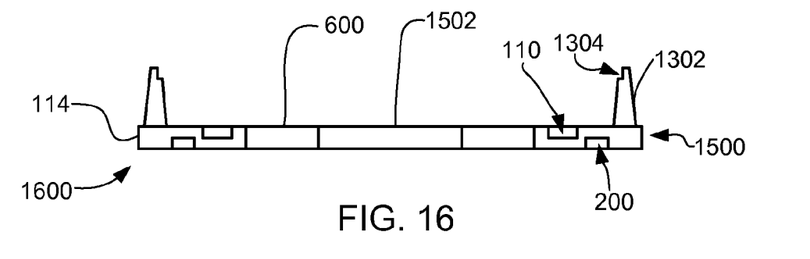
FIG. 16 is a pre-molded leadframe for wire bonding a die.

Referring now to FIG. 16, therein is shown a pre-molded leadframe 1600 for wire bonding a die. The optional heat spreader holder 1302 is formed as an integral part of the pre-molded leadframe 1600. Typically, the heat spreader holder has a number of the inwardly directed notch 1304 that provides support for subsequent mounting of a heat spreader.

The leadframe 1500 after the pre-molding process has the spaces in the leadframe 1500 filled with the first molding material 600. A number of the upper half-etched portion 110 and a number of the lower half-etched portion 200 are filled with the first molding material 600. The space between the die pad 1502 and the number of leads 114 also is filled with the first molding material 600.

Figure 17:
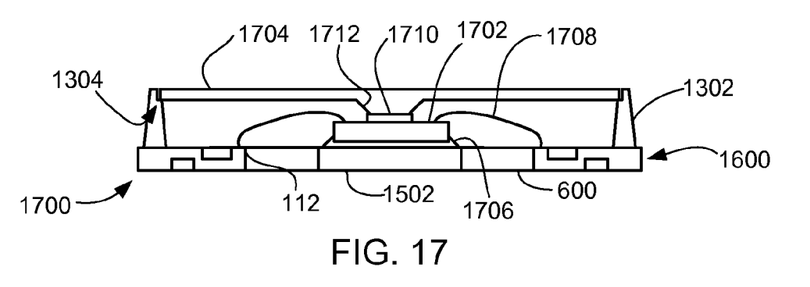
FIG. 17 is a semiconductor package having the pre-molded leadframe having a die wire bonded to the die pad and a heat spreader.

Referring now to FIG. 17, therein is shown a semiconductor package 1700 having the pre-molded leadframe 1600 having a die 1702 wire bonded to the die pad 1502 and a heat spreader 1704. A metal finish process has been performed to provide a wettable surface on the number of terminal pads 112. The die 1702 is connected to the leadframe 100 by attaching the die 1702 to the die pad 1502 using a die attach adhesive material layer 1706. The die 1702 is electrically connected to the number of terminal pads 112 by wire bonding the die 1702 using a number of wires 1708. The pre-molded leadframe 1600 provides a rigid and stable base during the die attach and wire bonding processes.

The heat spreader 1704 is attached to the upper surface of the die 1702 using a thermally conductive adhesive layer 1710. The outer edges of the heat spreader 1704 are positioned in a number of the inwardly directed notch 1304 formed in a number of the optional heat spreader holder 1302. The heat spreader 1704 has a centrally located bump portion 1712 that can be varied in height depending upon the thickness of the die 1702 used in a particular design. The thermally conductive adhesive layer 1710 is used to attach the centrally located bump portion 1712 to the die 1702.

For illustrative purposes, the heat spreader 1704 is shown with the optional heat spreader holder 1302 although it is understood that the heat spreader 1704 may also be a shield attached to the pre-molded leadframe 1600 on a surface including the number of terminal pads 112 over the first molding material 600 or the number of terminal lands 108 of FIG. 1. Further the heatspreader 1400 can be attached to ground pads (not shown) over corners of the first molding material 600 or a top side of exposed pads (not shown) or leads (not shown) along edges of the pre-molded leadframe 1600.

Figure 18:
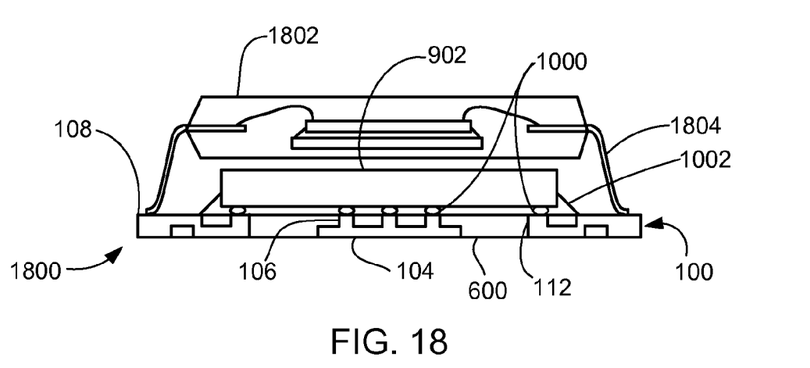
FIG. 18 is a semiconductor package with stacked packages.

Referring now to FIG. 18, therein is shown a semiconductor package 1800 with stacked packages. The die 902 is attached to the leadframe 100 using the underfill material layer 1002 as described above with reference to FIG. 10. The number of solder bumps 1000 connects the die 902 to the number of thermal/ground bump pads 106 and the number of terminal pads 112. A second semiconductor 1802 is attached to the upper surfaces of the number of terminal lands 108 using a number of external leads 1804.

Figure 19:
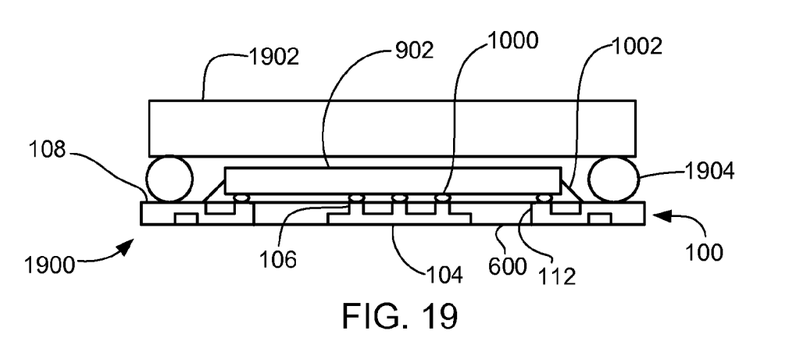
FIG. 19 is a semiconductor package with stacked dies.

Referring now to FIG. 19, therein is shown a semiconductor package 1900 with stacked dies. The die 902 is attached to the leadframe 100 using the underfill material layer 1002 as described above with reference to FIG. 10. The number of solder bumps 1000 connects the die 902 to the number of thermal/ground bump pads 106 and the number of terminal pads 112. A second die 1902 is connected to the upper surfaces of the number of terminal lands 108 using a number of solder balls 1904.

Figure 20:
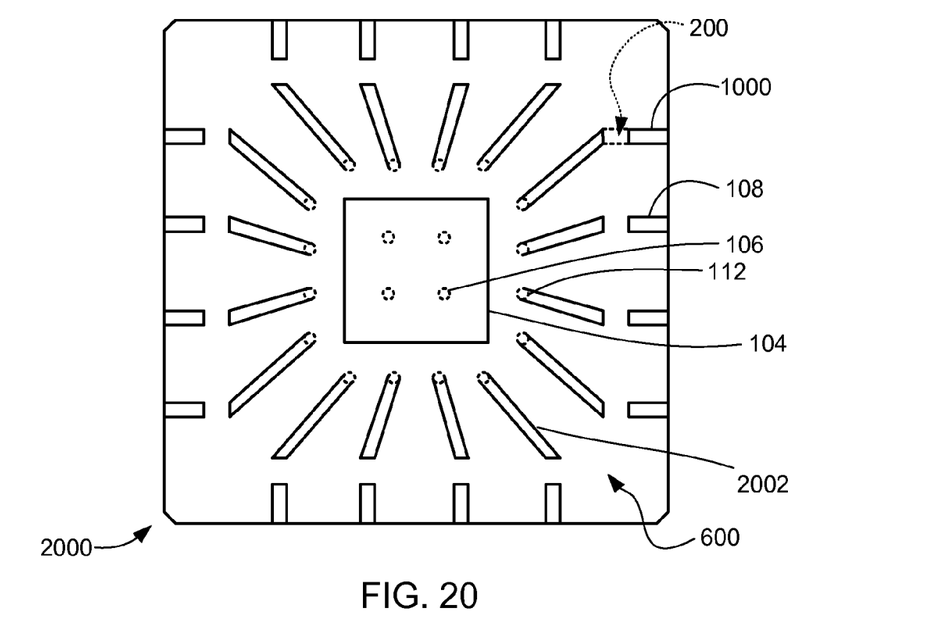
FIG. 20 is a bottom view of a pre-molded leadframe with a number of fan out pads.

Referring now to FIG. 20, therein is shown a bottom view of a pre-molded leadframe 2000 with a number of fan out pads 2002. The number of fan out pads 2002 is optional depending upon the particular semiconductor package design. For example, if a small die is to be mounted on the upper surface of the pre-molded leadframe 2000, the number of fan out pads 2002 extend inwardly from the number of terminal lands 108 to move the number of terminal pads 112 closer to the die pad 104.

Additionally, it is generally known that some test sockets scrape the surface of the test contact pads to obtain a good electrical contact for the solder joints. This scraping often causes damage to the pre-plated layer on the number of terminal lands 108 resulting in reduced solder joint integrity. To address this issue, the number of fan out pads 2002 also can serve as test contact pads to avoid damage to the number of terminal lands 108 by the test sockets thereby avoiding damage to the number of terminal lands 108 and enhancing solder joint integrity.

Figure 21:
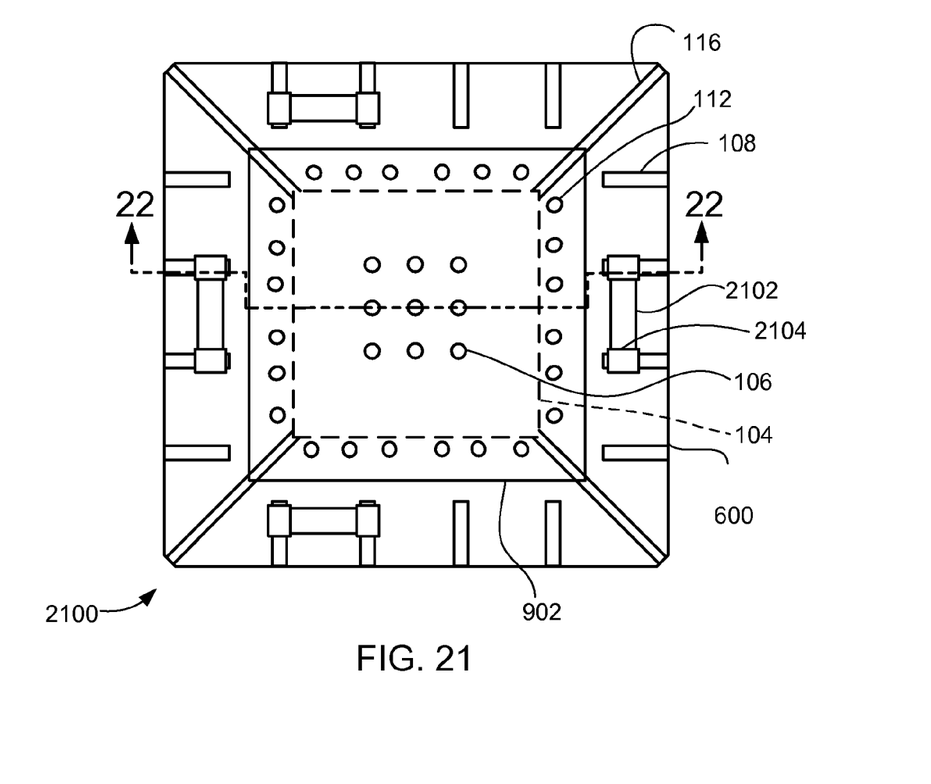
FIG. 21 is a top view of a semiconductor package including a number of passive devices.

Referring now to FIG. 21, therein is shown a top view of a semiconductor package 2100 including a number of passive devices 2102. The semiconductor package 2100 includes the die 902 attached to the number of thermal/ground bump pads 106 on the die pad 104 and to the number of terminal pads 112. The number of passive devices 2102 has a number of outer contacts 2104. The number of outer contacts 2104 is connected to adjoining pairs of the number of terminal lands 108 around the periphery of the die 902 as required for a particular design.

Figure 22:
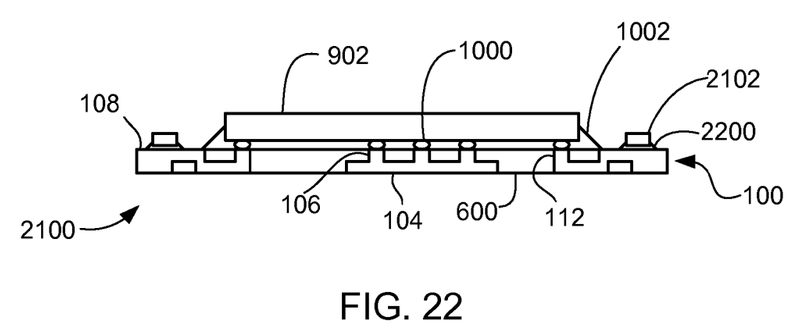
FIG. 22 is a cross-sectional view of the structure of FIG. 21 taken along line 22-22.

Referring now to FIG. 22, therein is shown a cross-sectional view of the structure of FIG. 21 taken along line 22-22. A metal finish process has been performed to provide a wettable surface on the number of thermal/ground bump pads 106 and the number of terminal pads 112. The number of solder bumps 1000 is placed over the number of thermal/ground bump pads 106 and the number of terminal pads 112. The die 902 is attached to the leadframe using the underfill material layer 1002 as described above with reference to FIG. 10. The die 902 is electrically connected to the number of thermal/ground bump pads 106 and the number of terminal pads 112 by using a solder reflow process on the number of solder bumps 1000. The number of passive devices 2102 shown in FIG. 21 is attached to the number of terminal lands 108 using an electrically conductive adhesive or solder 2200. The present invention provides a rigid and stable base during the metal finish process and the solder bump, die placement, and passive device placement processes.

Figure 23:
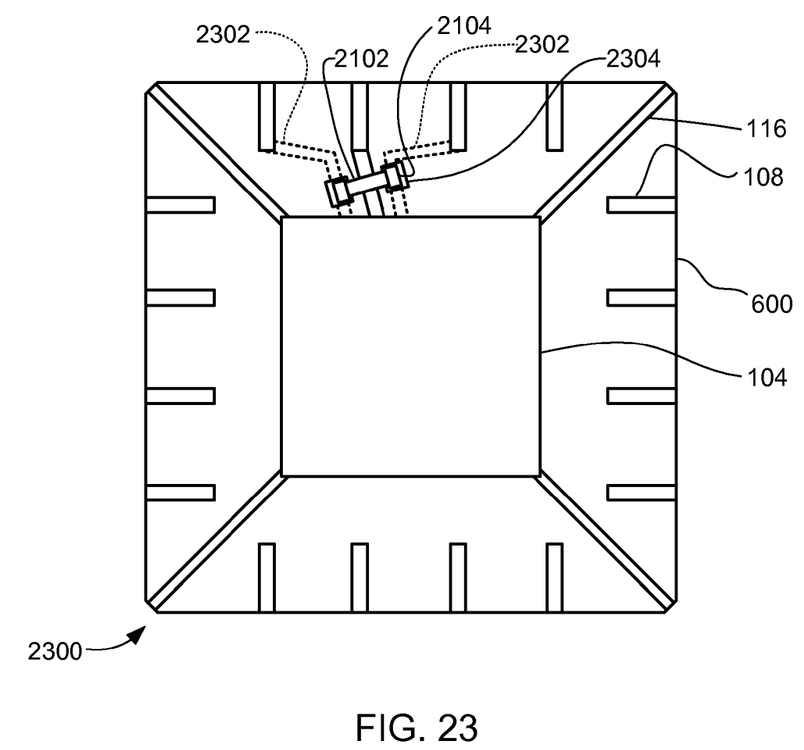
FIG. 23, is a top view of a semiconductor package having a number of buried leadframe traces and a number of exposed terminal pads with the number of passive devices attached to the number of exposed terminal pads.

Referring now to FIG. 23, therein is shown a top view of a semiconductor package 2300 having a number of buried leadframe traces 2302 and a number of exposed terminal pads 2304 with the number of passive devices 2102 attached to the number of exposed terminal pads 2304. The number of buried leadframe traces 2302 and the number of exposed terminal pads 2304 are formed during the metal finish process. The number of passive devices 2102 is attached to the number of exposed terminal pads 2304 using the electrically conductive adhesive or solder 2200 as shown in FIG. 22 to attach the number of outer contacts 2104 of the number of passive devices 2102 to the number of exposed terminal pads 2304.

Figure 24:
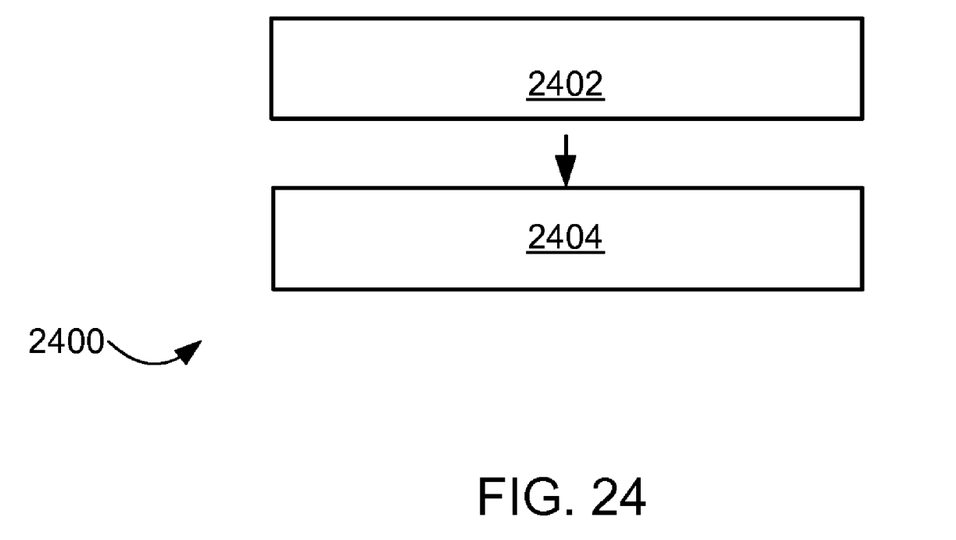
FIG. 24 is a flow chart of a method for manufacturing a semiconductor package in accordance with the present invention.

Referring now to FIG. 24, therein is shown a flow chart of a method 2400 for manufacturing a semiconductor package in accordance with the present invention. The method 2400 includes providing a leadframe having a die pad and a plurality of leads in a block 2402; and forming a first molding material in the leadframe to expose an upper surface of the die pad and the upper surfaces of the plurality of leads in a block 2404.

The present invention prevents mold flash by using two parallel mold plates clamping tightly on terminal lands on the terminal leads, on the plurality of thermal/ground bump pads, and the plurality of bump pads.

The defined bump pad areas are formed with molding compound surrounding the plurality of thermal/ground bump pads and the plurality of bump pads serving as a non-wettable barrier.

The recesses formed in the pre-molded leadframe provide stress relief and mold locking capabilities.

The present invention helps relieve shear strain on the solder joints in the semiconductor package to improve solder joint fatigue life.

The pre-molding process is independent of die assembly enabling the use of die on usable pre-molded leadframes thereby reducing semiconductor failure due to molding induced defects.

The present invention provides more stable leads for subsequent wire bonding, or flip chip attachment processes.

The present invention can be used to provide heat spreaders, radiation shields, and transparent lids in the semiconductor package.

The present invention can be used in die and package stacking applications, and may incorporate passive devices.

Thus, it has been discovered that the method and apparatus of the present invention furnish important and heretofore unavailable solutions, capabilities, and functional aspects for semiconductor manufacturing. The resulting process and configurations are straightforward, economical, uncomplicated, highly versatile, and effective, use conventional technologies, and are thus readily suited for manufacturing semiconductor devices that are fully compatible with conventional manufacturing processes and technologies.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing a semiconductor package, comprising:
   providing a leadframe having a die pad and a plurality of leads; and
   forming a first molding material in the leadframe to expose an upper surface of the die pad and the upper surfaces of the plurality of leads.

2. The method of manufacturing a semiconductor package as claimed in claim 1, further comprising:
   forming a plurality of thermal/ground bump pads on the die pad wherein the upper surfaces of the thermal/ground bump pads form the upper surface of the die pad; and
   forming a plurality of terminal pads on the plurality of leads wherein the upper surfaces of the plurality of terminal pads form the upper surface of the plurality of leads.

3. The method of manufacturing a semiconductor package as claimed in claim 1, further comprising:
   providing a heat spreader holder integral with the first molding material for attaching at least one of a heat spreader, a radiation shield, a transparent lid, and combinations thereof.

4. The method of manufacturing a semiconductor package as claimed in claim 1, further comprising:
   attaching at least one of a heat spreader, a radiation shield, a transparent lid, and combinations thereof over a side of the leadframe having the upper surfaces of the plurality of leads.

5. The method of manufacturing a semiconductor package as claimed in claim 1, further comprising:
   attaching a die to the upper surface of the die pad; and
   connecting the die to the plurality of leads.

6. A method of manufacturing a semiconductor package, comprising:
   forming a die pad having a plurality of thermal/ground bump pads on the die pad;

forming a plurality of leads having a plurality of terminal pads on the plurality of leads; and forming a first molding material in the leadframe to expose an upper surface of the plurality of thermal/ground bump pads and an upper surface of the plurality of terminal pads; and connecting a die to the plurality of thermal/ground bump pads and the plurality of terminal pads.

7. The method of manufacturing a semiconductor package as claimed in claim 6, wherein:

forming the plurality of thermal/ground bump pads and the plurality of terminal pads half-etches the upper surfaces of the die pad and the plurality of leads.

8. The method of manufacturing a semiconductor package as claimed in claim 6, wherein connecting the die uses at least one of solder balls, solder bumps, wire bonds, and a combination thereof.

9. The method of manufacturing a semiconductor package as claimed in claim 6, further comprising:

providing a heat spreader holder integral with the first molding material for attaching at least one of a heat spreader, a radiation shield, a transparent lid, and combinations thereof.

10. The method of manufacturing a semiconductor package as claimed in claim 6, further comprising:

half-etching a notch in the lower surface of the plurality of leads intermediate the plurality of terminal pads and the outer edges of the plurality of leads.

11. A semiconductor package comprising:

a leadframe having a die pad and a plurality of leads; and a first molding material in the leadframe to expose an upper surface of the die pad and the upper surfaces of the plurality of leads.

12. The semiconductor package as claimed in claim 11, further comprising:

a plurality of thermal/ground bump pads on the die pad wherein the upper surfaces of the thermal/ground bump pads form the upper surface of the die pad; and a plurality of terminal pads on the plurality of leads wherein the upper surfaces of the plurality of terminal pads form the upper surface of the plurality of leads.

13. The semiconductor package as claimed in claim 11, further comprising:

a heat spreader holder integral with the first molding material for attachment of at least one of a heat spreader, a radiation shield, a transparent lid, and combinations thereof.

14. The semiconductor package as claimed in claim 11, further comprising:

a heat spreader, a radiation shield, a transparent lid, and combinations thereof over a side of the leadframe having the upper surfaces of the plurality of leads.

15. The semiconductor package as claimed in claim 11, further comprising:

a die attached to the upper surface of the die pad; and a plurality of connections connecting the die to the plurality of terminal leads.

16. The semiconductor package as claimed in claim 11, wherein:

the die pad is a die pad having a plurality of thermal/ground bump pads on the die pad;

the plurality of leads is a plurality of leads having a plurality of terminal pads on the plurality of leads;

the first molding material is a first molding material in the leadframe to expose an upper surface of a plurality of thermal/ground bump pads and an upper surface of a plurality of terminal pads; and further comprising:

a die connected to the plurality of thermal/ground bump pads and the plurality of terminal pads.

17. The semiconductor package as claimed in claim 16, wherein:

the plurality of thermal/ground bump pads and the plurality of terminal pads are half-etched from the upper surfaces of the die pad and the plurality of leads.

18. The semiconductor package as claimed in claim 16, further comprising:

at least one of solder balls, solder bumps, wire bonds, and a combination thereof to connect the die to the plurality of thermal/ground bump pads and the plurality of terminal pads.

19. The semiconductor package as claimed in claim 16, further comprising:

a heat spreader holder integral with the first molding material for attachment of at least one of a heat spreader, a radiation shield, a transparent lid, and combinations thereof.

20. The semiconductor package as claimed in claim 16, wherein:

the plurality of leads has a notch in the lower surface of the plurality of leads intermediate the plurality of terminal pads and the outer edges of the plurality of leads.

* * * * *